(12) United States Patent
Ryding et al.

(10) Patent No.: US 9,887,066 B2
(45) Date of Patent: Feb. 6, 2018

(54) SYSTEMS FOR CONTROLLING A HIGH POWER ION BEAM

(71) Applicant: NEUTRON THERAPEUTICS INC., Danvers, MA (US)

(72) Inventors: Geoffrey Ryding, Manchester, MA (US); Takao Sakase, Rowley, MA (US); Theodore Smick, Gloucester, MA (US)

(73) Assignee: NEUTRON THERAPEUTICS INC., Danvers, MA (US)

( * ) Notice: Subject to any disclaimer, the term of this patent is extended or adjusted under 35 U.S.C. 154(b) by 0 days.

(21) Appl. No.: 15/325,594

(22) PCT Filed: Jul. 8, 2015

(86) PCT No.: PCT/US2015/039498
§ 371 (c)(1),
(2) Date: Jan. 11, 2017

(87) PCT Pub. No.: WO2016/007588
PCT Pub. Date: Jan. 14, 2016

(65) Prior Publication Data
US 2017/0178859 A1    Jun. 22, 2017

Related U.S. Application Data

(60) Provisional application No. 62/023,526, filed on Jul. 11, 2014.

(51) Int. Cl.
*H01J 37/304* (2006.01)
*H01J 37/317* (2006.01)
*H01J 37/244* (2006.01)

(52) U.S. Cl.
CPC ........ *H01J 37/3045* (2013.01); *H01J 37/244* (2013.01); *H01J 37/3171* (2013.01);
(Continued)

(58) Field of Classification Search
CPC .. H01J 37/3045; H01J 37/244; H01J 37/3171; H01J 2237/8035;
(Continued)

(56) References Cited

U.S. PATENT DOCUMENTS 7,982,195 B2    7/2011  Agarwal et al.
2009/0084757 A1  4/2009  Erokhin et al.
(Continued)

OTHER PUBLICATIONS

PCT International Search Report for PCT International Patent Application No. PCT/US2015/039498; dated Nov. 13, 2015; (3 pages).

(Continued)

*Primary Examiner* — Nicole Ippolito
*Assistant Examiner* — Hanway Chang
(74) *Attorney, Agent, or Firm* — DLA Piper LLP (US); Larissa Bifano Park

(57) ABSTRACT

A system for controlling a high-power ion beam is disclosed, such as for steering, measuring, and/or dissipating the beam's power. In one embodiment, the ion beam can be controlled by being imparted into a cylindrical tube (e.g., a faraday cup), and deflected to strike an interior tube wall at an angle, thereby increasing an impact area of the beam on the wall. By also rotating the deflected beam around a circumference of the interior wall, the impact area of the ion beam may be further increased, thereby absorbing (dissipating) the high-power ion beam on the wall. In another embodiment, the ion beam may be passed through first, second, and third adjustable magnetic rings. By adjusting a relative angle between the rings and a combined rotation angle of all of the rings, a deflected ion beam may be rotated around a circumference of the interior wall of a power-absorbing tube, accordingly.

22 Claims, 13 Drawing Sheets

(52) U.S. Cl.
CPC ............... *H01J 2237/0835* (2013.01); *H01J 2237/24405* (2013.01); *H01J 2237/24507* (2013.01); *H01J 2237/3142* (2013.01)

(58) Field of Classification Search
CPC ... H01J 2237/24405; H01J 2237/24507; H01J 2237/3142
USPC ............................. 250/492.1, 492.2, 492.3
See application file for complete search history.

(56) References Cited

U.S. PATENT DOCUMENTS

| | | |
|---|---|---|
| 2010/0237232 A1 | 9/2010 | Chen |
| 2013/0146451 A1 | 6/2013 | Child |
| 2014/0163537 A1 | 6/2014 | Joos et al. |

OTHER PUBLICATIONS

PCT Written Opinion for PCT International Patent Application No. PCT/US2015/039498; dated Nov. 13, 2015; (17 pages).

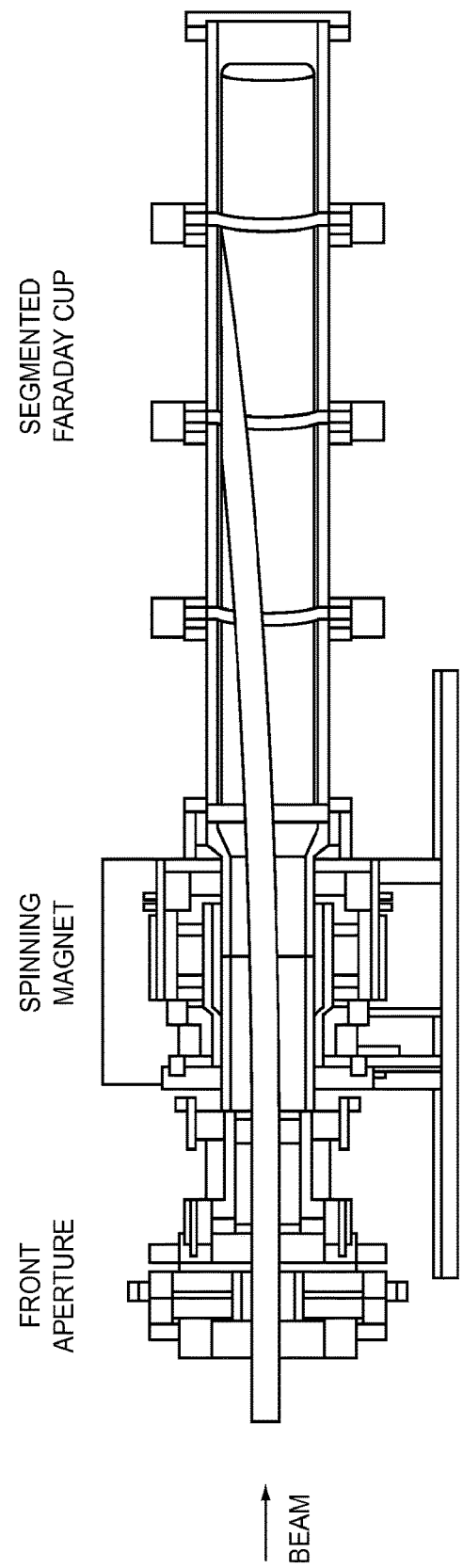

SYSTEMS FOR CONTROLLING A HIGH POWER ION BEAM

CROSS-REFERENCE TO RELATED APPLICATION

The present application is a U.S. National Stage application based on PCT International Application No. PCT/US2015/039498 filed Jul. 8, 2015, which claims the benefit of U.S. Patent Application No. 62/023,526 filed Jul. 11, 2014, each of which is incorporated herein by reference.

BACKGROUND OF THE INVENTION

1. Field of the Invention:

The present invention relates to a system for controlling a high-power ion beam such as for ion implanters, and, more particularly, to steering, measuring, and/or dissipating the power of the high-power ion beam, and an associated magnetic beam steering system.

2. Description of the Related Art:

Ion implantation is a materials engineering process by which ions of a material are accelerated in an electrical field and impacted into a solid. This process is used to change the physical, chemical, or electrical properties of the solid. Ion implantation is often used in semiconductor device fabrication and in metal finishing, as well as various applications in materials science. Ion implantation equipment typically consists of an ion source, where ions of the desired element are produced, an accelerator, where the ions are electrostatically accelerated to a high energy, and a target chamber, where the ions impinge on a target, which is the material to be implanted. The energy of the ions, as well as the ion species and the composition of the target, determine the depth of penetration of the ions in the solid, i.e., the "range" of the ions.

There are various uses for ion implantation, such as the introduction of dopants (e.g., boron, phosphorus or arsenic) into a semiconductor material such as silicon. Another use for ion implantation is for cleaving (exfoliating) thin sheets (lamina) of hard crystalline materials such as silicon, sapphire, etc. Generally, this process involves implanting light ions into the material where they will stop below the surface in a layer. The material may then be heated (for example), causing the material above the implanted layer to cleave off or exfoliate in a sheet or lamina.

A proton accelerator is an example ion beam source that produces ion beams. In some instances, such ion beams have power intensities of about 100 kW, and may have sizes of approximately 10 mm in diameter. In general, it is not possible to handle this power density with a stationary water-cooled or radiation-cooled surface, particularly when dissipating or "dumping" the beam's power. The problem is generally solved by dissipating the power over a larger area. In one arrangement, this can be accomplished by rotating the target upon which the ion beam strikes, such as a large disk or drum, so no one portion of the target absorbs the full power of the ion beam. For example, the target in a typical beam dump system may have a diameter of approximately 2 m or greater, which rotates at approximately 100 rpm or greater, thus spreading the power dissipation over a large area. An alternative approach is to scan the beam over a larger area—that is, moving the beam over the target instead of moving the target.

The current systems for controlling high-power ion beams, particularly to dissipate the power of the beam during a beam dump, are large and bulky, expensive, and don't provide any function other than to absorb the ion beam's power.

SUMMARY OF THE INVENTION

The present invention relates to a system for controlling a high-power ion beam such as for ion implanters (e.g., for semiconductor doping or hydrogen induced exfoliation), and, more particularly, to steering, measuring, and/or dissipating the power of the high-power ion beam, and an associated magnetic beam steering system.

In one embodiment, the ion beam (having an original cross sectional area) can be controlled by imparting the ion beam along a beam path, such as into an end of a tube, and causing the ion beam to deflect from the beam path and to strike a target surface, such as an interior wall of the tube, at an angle, thereby creating an impact area of the ion beam on the target wall that is greater than the original cross sectional area. By also scanning or rotating the deflected ion beam, such as around a circumference of the interior wall of the tube, the impact area of the ion beam on the target interior wall may be further increased, thereby absorbing (dissipating or "dumping") the ion beam power by the increased impact area on the interior wall. Alternatively, or in addition, the target wall can be mechanically moved into the beam path, thereby intercepting the ion beam and causing the beam power to be dissipated.

In another embodiment, the tube is a faraday cup, and an ion beam intensity from the beam power striking the interior wall can be measured. In a specific embodiment, the interior wall of the faraday cup may be segmented into a plurality of sections, allowing for greater measurement granularity.

In still another embodiment for controlling the ion beam, the ion beam may be passed through a first, second, and third adjustable ring, each ring configured with magnets to produce a magnetic field vector, the first ring nearest an entrance of the ion beam passage, the third ring nearest an exit of the ion beam passage, and the second ring between the first and third rings. A relative angle between the first, second, and third ring may then be adjusted to control a magnitude of ion beam deflection from the exit. Additionally, a combined rotation angle of all of the first, second, and third rings may be adjusted to control azimuthal direction of the ion beam deflection. In this manner, for example, this ion beam controlling magnetic structure may be used to rotate a deflected ion beam around a circumference of the interior wall of a power-absorbing tube, as mentioned above.

Still further, in one particular embodiment, the systems described herein may be used with Boron Neutron Capture Therapy (BNCT), where a proton ion beam emerging from the tube can be directed at a lithium target in order to provide a source of neutrons resulting from the Li(p,n) nuclear reaction.

In another embodiment, the systems described herein may be used with proton induced exfoliation, which enables production of ultra-thin layers of a substrate, such as single crystal sapphire. These layers can then be bonded to less expensive materials so as to provide the properties of sapphire but at a lower overall cost. For instance, in this embodiment, a thick wafer of the substrate (e.g., sapphire) is irradiated with a beam of high energy protons, such as hydrogen ions. These ions penetrate to a precise depth below the surface of the sapphire wafer, forming a defect layer, and the wafer is then heated to cause the surface layer to separate, or exfoliate, thereby producing a thin layer with a precise thickness equal to the depth of the original implanted hydrogen. Since the layers are so thin, the process can be repeated many times so that multiple, high quality layers can be exfoliated from a single starting wafer.

It is to be understood that both the foregoing general description and the following detailed description are exemplary and explanatory only and are intended to provide further explanation of the present invention, as claimed.

BRIEF DESCRIPTION OF THE DRAWINGS

The embodiments herein may be better understood by referring to the following description in conjunction with the accompanying drawings in which like reference numerals indicate identically or functionally similar elements, of which:

FIGS. 7A-7B illustrate an example ion beam controller system in beam dump and pass-through modes.

DETAILED DESCRIPTION OF THE INVENTION

The techniques herein combine ion beam scanning with target scanning in a compact configuration, which may also provide information on the total beam intensity and profile of a high-power ion beam. Illustratively, the system described can be used to steer, intercept, and measure the intensity of high-power ion beams, such as those with a beam power having an intensity of approximately 80-120 kW (e.g., 100 kW). Notably, other beam intensities may also benefit from the techniques herein, such as lower power ion beams (e.g., 1-80 kW) or higher power ion beams (e.g., 120 kW and greater).

One way to increase the impact area of an ion beam on a target is to have the target surface tilted at a very oblique angle, $\theta$ (theta), to the incoming beam. In this way, the impact area is increased by a factor of $1/\cos(\theta)$. For example, changing the impact angle from normal (e.g., $\theta=0$ degrees) to oblique (e.g., $\theta=85$ degrees) increases the impact area by a factor of approximately 11.5. Another technique is to reduce the average power density of the beam's intensity by scanning the beam across the target so that the effective impact area is increased, such as by moving the beam or the target itself. In this case, the beam's power is spread over the target, but the beam must be scanned over the target fast enough to avoid instantaneous heating effects in any one particular impact area.

The present invention utilizes one or both of these techniques and preferably combines these two methods in a compact system by deflecting the ion beam at an angle and scanning ion beam over the target in order to achieve power density reductions of greater than 100. In general, in the present invention, the path of an ion beam is changed or deflected to cause the beam to strike a target positioned along the beam path and creating an impact area that is greater than the cross-sectional area of the beam. Preferably, the ion beam is passed through a tube, and the beam is deflected to impact the interior surface of the tube. The tube can have a variety of cross-sectional shapes, such as rectangular, square, or circular. Preferably, the tube is cylindrical. In addition, as described below, the configuration described herein may also be used to provide valuable information on the ion beam position, direction, and intensity profile.

Figure 1:
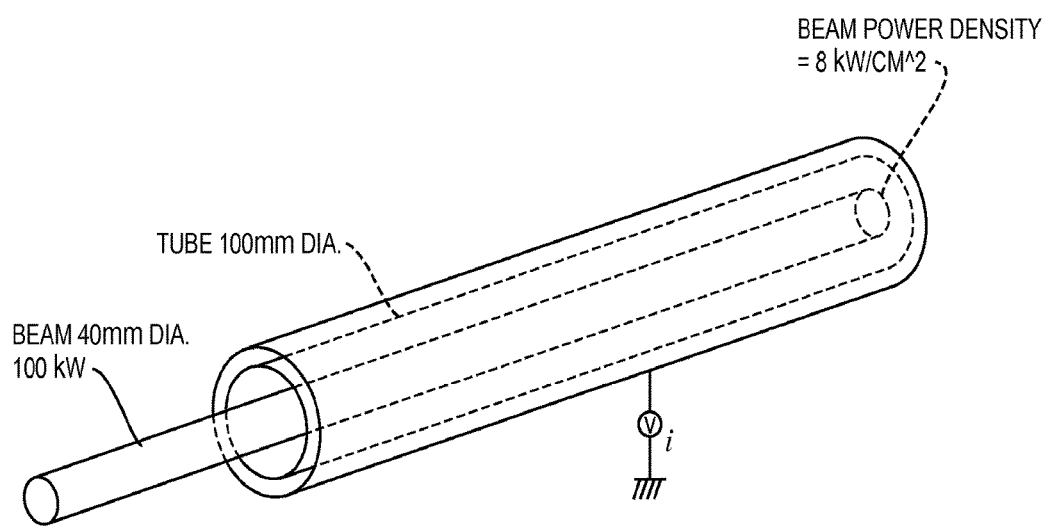
FIGS. 1-3 illustrate an example of controlling a high-power ion beam to dissipate the beam's power within a compact tubular beam deflection system and optional faraday cup configuration.

One or more specific embodiments of the present invention herein may be generally described with reference to FIGS. 1-3. In particular, for these specific embodiments, an ion beam may be imparted from an ion beam source into an end of a cylindrical tube (e.g., a 100 mm diameter tube). Illustratively, as shown in FIG. 1, the ion beam may be a 40 mm diameter beam (an original cross sectional area) with a power intensity of 100 kW, such that at the end of the tube (e.g., an end plate/cap or an exit), the beam power density is approximately 8 kW/cm^2.

Figure 2:
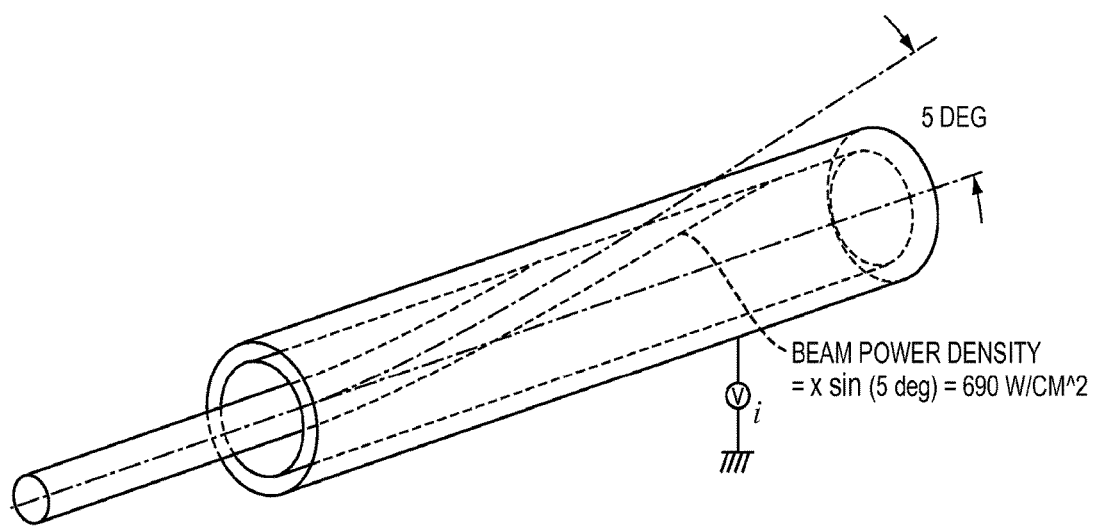

FIG. 2 illustrates the effect of an ion beam controller deflecting the beam through 5 degrees so that the beam now strikes a much larger area along the inside of the cylinder. In this case, the power density may be reduced to approximately 690 W/cm^2 (power x sin(5 degrees)). Said differently, deflecting the ion beam to strike an interior wall of the tube at an angle creates an impact area of the ion beam on the interior wall that is greater than the original cross sectional area, and thus spreads out the power of the ion beam. Note that the angle (created, for example, by field strength of magnets, described below) being 5 degrees (and thus $\theta$ being 85 degrees) is merely an example, and the angle(s) may be based on an interior size of the tube and a desired impact area of the ion beam on the interior wall.

Figure 3:
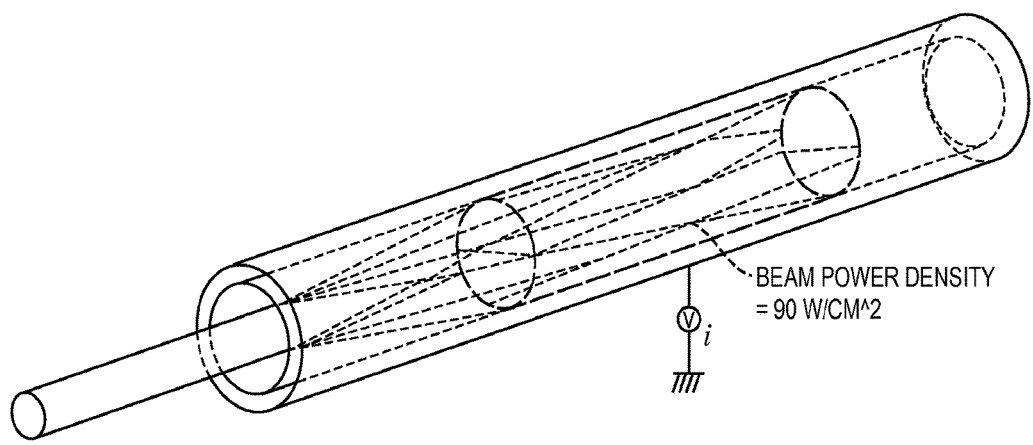

To move the target of the deflected beam, FIG. 3 shows the effect of rotating the deflection of the beam about the beam axis (e.g., by rotating a deflection apparatus or field vector as described below, or else rotating the tube itself) so that the beam is now scanned uniformly over the inside of the tube. In so doing, the beam power density may be additionally reduced to 90 W/cm^2 (diameter of the beam / circumference of the tube)) which is a combined reduction in power density of 98.87% or a factor of 88.9. In particular, by rotating the deflected ion beam around a circumference of the interior wall of the tube, the impact area of the ion beam on the interior wall is increased, thus allowing the beam power of the high-power ion beam to be absorbed by the increased impact area on the interior wall.

Notably, at least where the beam strikes the tube (e.g., in the 'dump' mode, described below) are designed to handle high beam powers. In one example embodiment, the tube may comprise a copper exterior tube with an interior wall lined with graphite. For instance, one manner of achieving this result is to provide a thin walled (e.g., about 2 mm) graphite tube that is 'heat shrunk' into the interior wall of an outer copper tube. Note also that various liquid cooling systems may be configured to liquid cool the tube, particularly from an exterior of the tube (e.g., water cooling the outside of a vacuum ion beam system).

FIGS. 1-3 also demonstrate one particular advantage of the described embodiment in which the tube is configured to act as a faraday cup. That is, a faraday cup analyzer may be configured to measure ion beam intensity from the beam power striking the interior wall. Faraday cups, as may be understood by those skilled in the art, are conductive (e.g., metal) structures designed to catch charged particles. The resulting current ("i") can be measured and used to determine the number of ions or electrons hitting the structure. In general, faraday cups are designed with an entrance for the ion beam, but no exit (hence, a "cup"), but so long as the structure is contained within a vacuum, any suitable conductive surface may suffice. Hence, though referenced as a "cup", the tube disclosed herein acts in essence as a faraday "cup", regardless of whether the tube has a capped end or an open exit, such as described below.

Figure 4:
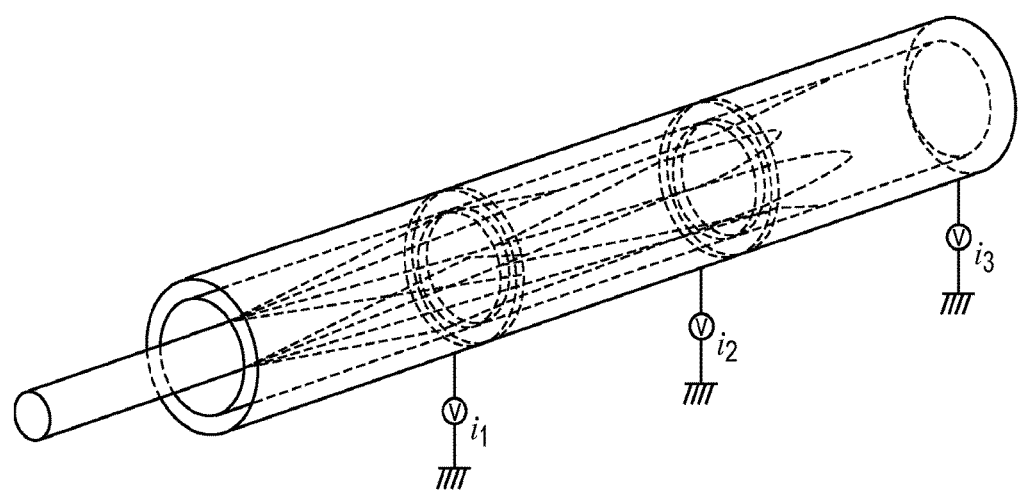
FIG. 4 illustrates an example of a segmented faraday cup for the compact tubular beam deflection system.

FIG. 4 illustrates the same basic geometry described in FIG. 3, but in this case the tubular walls of the faraday cup have been segmented so that the beam currents striking each tubular section (electrically isolated sections of the faraday cup) can be independently measured. That is, by segmenting the interior wall into a plurality of sections, a faraday cup analyzer can independently measure ion beam intensities of the beam power striking a respective section of the plurality of sections (e.g., "$i_1$", "$i_2$" and "$i_3$"). In so doing, information about the size, the shape, and the direction of the ion beam can be determined based on the independently measured ion beam intensities. For example, as shown in FIG. 4, since the impact area of the deflected beam is spread across the three sections in different amounts, the associated currents from each section (corresponding generally to the resultant surface area of the impact space) may be used to computationally deduce the information desired above, as may be appreciated by those skilled in the art.

Notably, as described herein, an ion beam controller may correspondingly adjust the ion beam based at least on the measured ion beam intensity (e.g., and size, shape, and/or direction of the beam, as well), such as in order to "tune" the ion beam to achieve a desired result (intensity, size, shape, direction, etc.).

Moreover, though the segmented faraday cup in FIG. 4 shows three sections, any number of sections may be used in accordance with the embodiments of the present invention, and with more sections comes greater granularity of measurement capability. In addition, such increased granularity may be used to determine specific mass components of the ion beam, such as $H^+$, $H_2^+$, and $H_3^+$, by aligning the ion beam and separating the different mass components (e.g., through specific magnetic control properties) to strike corresponding sections of the segmented faraday cup. In this manner, the system described herein may be configured as a mass spectrometer, e.g., using thirty sections to allow measuring the complete profile of the ion beam, and obtaining a complete mass spectrum. In other words, the faraday cup analyzer may be configured to perform mass spectrometry based on the independently measured ion beam intensities from the plurality of electrically isolated sections.

Still further, to provide even greater measurement capability, the ion beam controller may be configured to scan (sweep) the deflected ion beam across the plurality of sections to get a profile of the beam. In particular, the faraday cup analyzer can then measure ion beam information based on the deflected ion beam being scanned over each of the faraday cup sections over time, which would allow for additional measurements as the beam passes from one section to the next in a controlled manner.

According to one or more embodiments of the present invention, an ion beam controller that may be used to deflect and rotate the ion beam as described above may comprise a multi-directional beam scanning system. In particular, there are a number of ways to deflect and rotate the incoming ion beam, such as conventional electromagnetic or electrostatic beam scanning systems which are use commonly used in ion beam transport and implanter systems. One type of magnetic scanning system that is capable of generating the required magnetic fields is an "X-Y scanner" that is capable of bending an ion beam in both "X" and "Y" orthogonal directions. One example of an X-Y scanner that may be used is described in commonly owned, co-pending U.S. Provisional Patent Application Ser. No. 61/952,610, entitled "Magnetic Scanning System for Ion Implanters", filed by Park et al., on Mar. 13, 2014.

Figure 5:
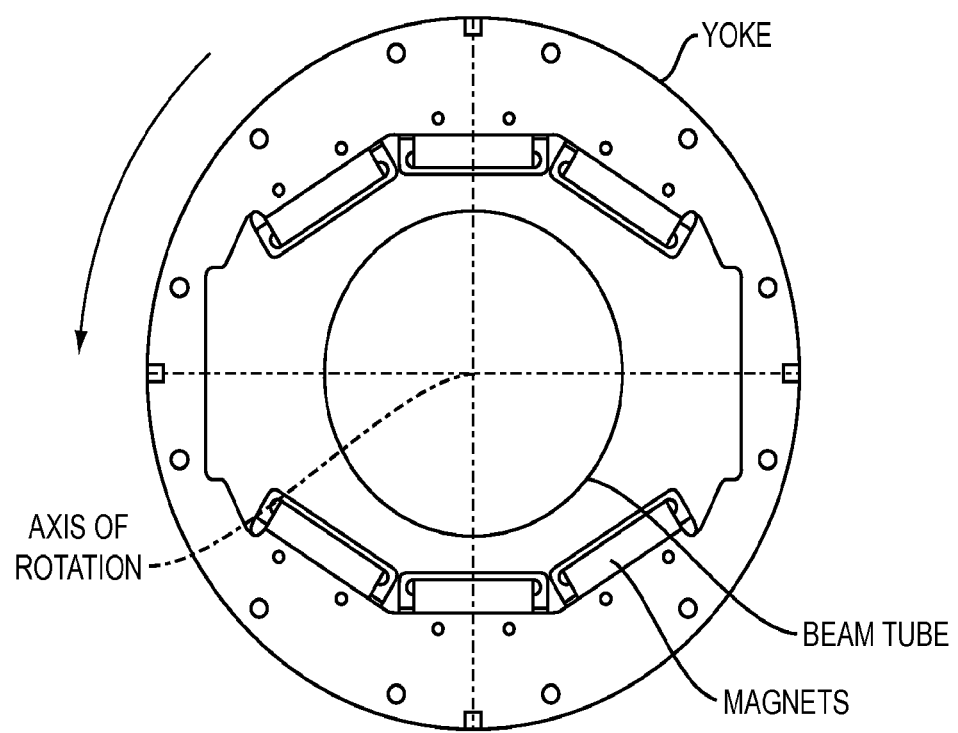
FIG. 5 illustrates an example of a spinning magnet beam deflection system.

In one specific embodiment, the multi-directional beam scanning system comprises an alternative design, where a fixed and uniform magnetic field is generated using a combination of magnets (e.g., permanent magnet) inside a yoke as shown schematically in FIG. 5. As described below, such a system may advantageously be placed entirely outside of the tube described above, and thus requires no moving parts inside the tube.

In the example shown, a central beam tube (such as the tube/faraday cup described above) is 100 mm in diameter, and the field produced across the tube by the magnet and yoke arrangement is approximately 1,500 G (shown by the generally vertical lines from the top magnets to the bottom magnets, as may be appreciated by those skilled in the art). Suitable for the beam deflection described above, this field produces a deflection angle of approximately 5 degrees for a 2 MeV proton beam. Other magnetic field strengths may be arranged for varying degrees of deflection and/or for varying beam powers/intensities.

In this example embodiment of the present invention, the magnet assembly may be mounted on a bearing system outside the evacuated beam chamber/tube through which the ion beam travels so that it can be easily rotated about the beam axis. In so doing, the magnetic field vector rotates and the proton beam is now scanned over a large effective area on the inside of the tube as illustrated in FIG. 4 above.

Figure 6A:
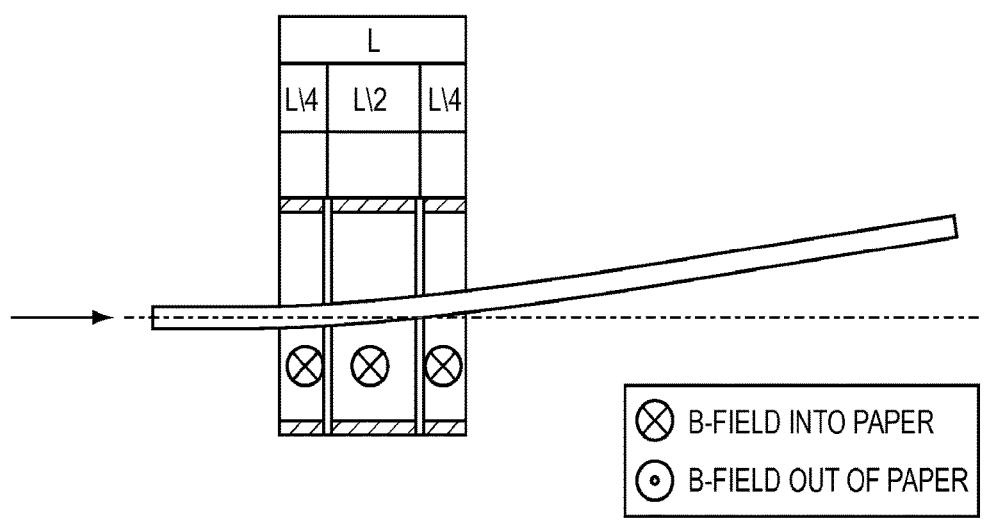
FIGS. 6A-6B illustrate an example of a tri-ring magnetic beam deflection system.

The system described herein can provide greater flexibility of control when the magnetic deflection apparatus shown in FIG. 5 is divided into three sections, which can each be rotated independently. An example of this is shown schematically in FIG. 6A, where three adjustable rings (e.g., sharing the magnetic structure of the yoke in FIG. 5) are shown, i.e., a first, second, and third adjustable ring (defining an aperture configured to allow passage of the ion beam), the first ring nearest an entrance of the ion beam passage, the third ring nearest an exit of the ion beam passage, and the second ring between the first and third rings. Each ring is configured with magnets to produce a magnetic field vector (B-field), which as shown in FIG. 6A can all be aligned in the same direction (effectively creating the same magnetic effect as the single magnetic structure of FIG. 5), thus bending the ion beam, accordingly. (Note that the angle of the bent beam and the B-field orientations are schematically drawn in two dimensions, though those skilled in the art will appreciate that the depiction is merely for example, and the relative angles are not meant to be to scale or limiting on the scope of the invention.)

Figure 6B:
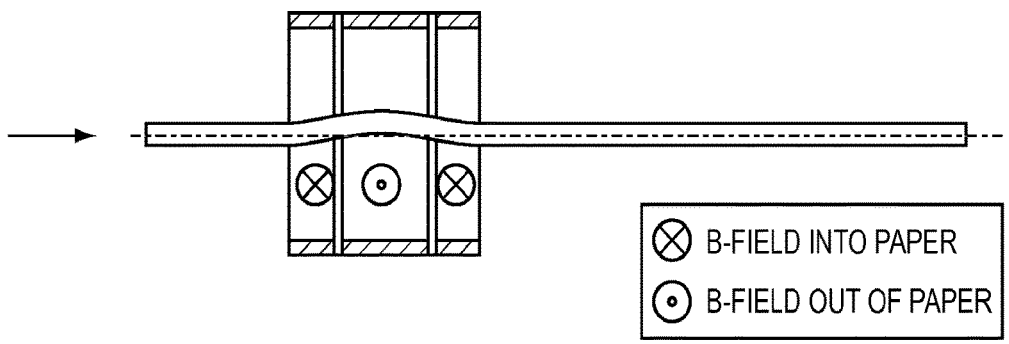

In accordance with one or more embodiments of the present invention, and with reference to both FIGS. 6A and 6B, adjusting a relative angle between the first, second, and third rings controls a magnitude of ion beam deflection from the exit. For instance, assume that the total length of the deflection section is L. In one illustrative embodiment, the three sections have lengths of L/4, L/2, and L/4 as shown (that is, the length of the first and third rings are substantially equal, and the length of the second ring is substantially equal to twice the length of the first and third rings). Now, if the magnetic field vector generated in the center (second) section is rotated so as to be in the same direction as the field vectors in the outer (first and third) sections, then the maximum deflection of the ion beam is achieved as shown in FIG. 6A (i.e., resulting in a maximum magnitude of ion beam deflection). If, on the other hand, the center section is rotated 180 degrees so that the field vector (with L/2 length) is in the opposite direction to the field vectors at the entrance and exit as shown in FIG. 6B (i.e., in a 180-degree opposite direction as magnetic field vectors of the first and third rings), then the resultant net deflection of the beam is zero (a zero-degree magnitude of ion beam deflection). In essence, this effectively creates a slight "chicane" in the passage of the ion beam through the magnetic deflection apparatus, where the beam exits the apparatus in the same straight line as it entered. Note that in one embodiment, from a rotation point of view it may be convenient to connect the entrance section to the exit section, thus configuring the first and third rings to adjust in unison.

As described above, adjustment of the relative angle between the center section and the end sections of the deflector controls the magnitude of the beam deflection. In addition, in accordance with one or more embodiments herein, adjustment of the rotation angle of the combined deflector assembly controls the azimuthal direction of this correction. Said differently, adjusting a combined rotation angle of all of the first, second, and third rings controls azimuthal direction of the ion beam deflection. In one embodiment, the first, second, and third rings are configured to adjust the rotational angle by moving in unison as a single assembly, but other arrangements are possible (i.e., coordinating the individual movements of the rings).

In this manner, and with general reference to FIG. 7A, when the ion beam passes through a cylindrical tube (such as described with reference to FIGS. 1-4 above, as described above, an the beam may then be deflected by the multi-directional beam scanning system (of FIGS. 5-6B) to strike an interior wall of the tube at an angle, thereby creating an impact area of the ion beam on the interior wall that is greater than an original cross sectional area of the ion beam, and also rotated (spun) around a circumference of the interior wall of the tube to further increase the impact area, thus allowing a beam power of the ion beam to be absorbed by the increased impact area on the interior wall. In this configuration, the system described herein acts as a "beam dump", dissipating the energy of the ion beam safely in a controlled manner. Also, while in this mode, when the tube is configured as a faraday cup, the relative angle between the first, second, and third rings and the combined rotation angle the rings can be adjusted based on measurements from the faraday cup as described above.

Figure 7B:
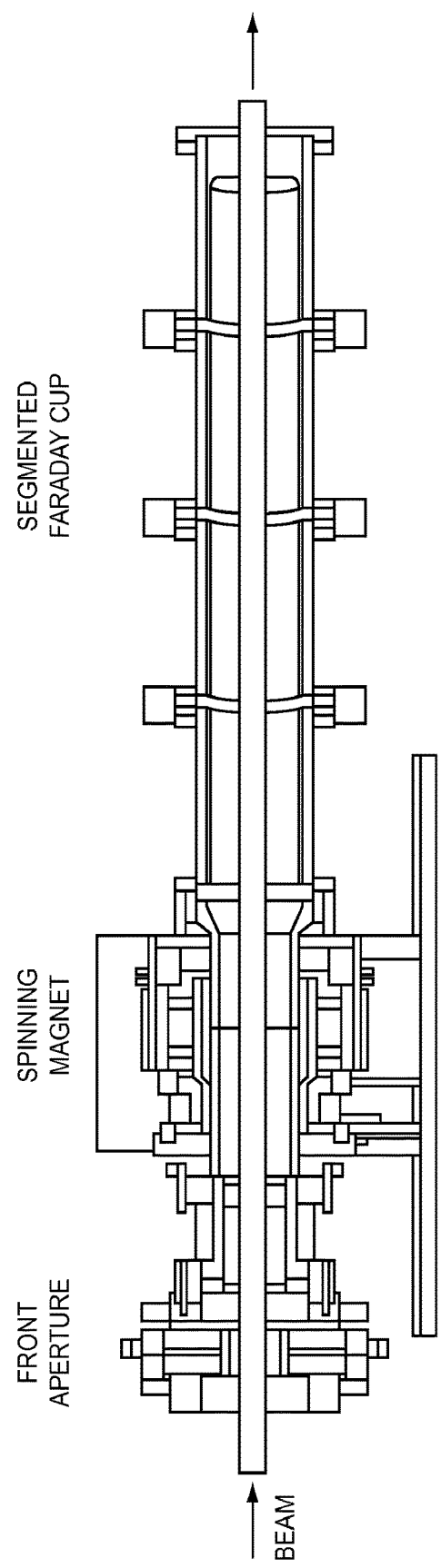

Note that with reference generally to FIGS. 7A and 7B, the system described herein may be used to alternate between a beam dump mode and a pass-through mode. For instance, beam dump mode may be used to prevent the ion beam from exiting the end of the tube and striking a target substrate, such as when the target substrate is being set up, replaced, adjusted, etc. That is, in pass-through mode, the tube has an egress at an end opposite the ion beam source (e.g., consistently open, or else a removable end cap), and the ion beam controller directs the ion beam out of the tube to strike a target substrate (i.e., with the original cross section of the ion beam). Also, where the tube is configured as a faraday cup, the ion beam may be adjusted based on the obtained measurements while in dump mode, so that when the beam is changed to pass-through mode (e.g., by spinning/rotating the magnet assembly to "un-bend" the beam), the target substrate out the end of the tube is struck with the desired beam configuration. The configuration described herein can thus be used as a 'removable beam dump' and 'beam profile measurement' system simply by changing the rotational angle between the magnetic deflection segments. Moreover, this functionality may be achieved without requiring any movable mechanisms in the vacuum system, since the magnetic assembly (e.g., the first, second, and third rings) may be located entirely outside of an evacuated beam chamber through which an ion beam travels.

It should also be noted that this architecture can be used as a "beam steerer" when the beam is in the "pass-through" mode, as shown in FIG. 7B. For instance, any slight angular misalignment of the beam can easily be corrected by fine adjustment of the rotation angles of the magnetic deflection segments, particularly where the magnetic field vector of the second ring is adjustable to be in any direction relative to the magnetic field vectors of the first and third rings. Note that in one simplified embodiment, the magnetic field vector of the second ring is configured to only be either i) the same as the magnetic field vectors of the first and third rings, or ii) the 180-degree opposite direction as magnetic field vectors of the first and third rings (e.g., "locking" in either extreme position). However, in the embodiment previously mentioned, any varying degree of rotation angle may be available to tune the ion beam's deflection, accordingly. This may be of particular use when the target of the beam (e.g., a wafer or substrate) is larger than the cross-section of the irradiating beam, allowing the beam to be scanned across the entire surface of the target. Note that in one additional embodiment, an additional beam control system may be located at the egress end of the tube for even greater (e.g., wider) control of the ion beam.

Though one embodiment of the magnetic deflection assembly uses permanent magnets that may be rotated to the various configurations, an alternative (or additional) embodiment utilizes electromagnets in a similar manner. For example, where the ion beam controller comprises an electromagnet system, a stationary electromagnet system may be configured to rotate the deflected ion beam by adjusting magnetic field strengths, polarities, etc. That is, in one embodiment, the electromagnets are stationary, and the magnetic field is adjusted and rotated, causing the beam to move.

Advantageously, the techniques described herein provide a system for controlling a high-power ion beam such as for ion implanters. In particular, the systems described herein can steer, measure, and/or dissipate the power of the high-power ion beam, and may do so using an associated magnetic beam steering system. Notably, the systems described herein are compact and inexpensive as compared to conventional beam dump designs, e.g., being approximately ten times smaller than spinning disk or spinning drum systems. Also, the systems herein require no moving parts or water cooling to be located in the vacuum system vacuum, thus avoiding rotary vacuum seals and rotary water seals, and being able to be "inserted" or "removed" from the beam with no moving parts in the vacuum, greatly simplifying beam dump operation. Note that in one embodiment, it is still possible to rotate the deflected ion beam by rotating the tube, and as such, vacuum seals, water/cooling seals, etc., may be required for such an embodiment.

Figure 8:
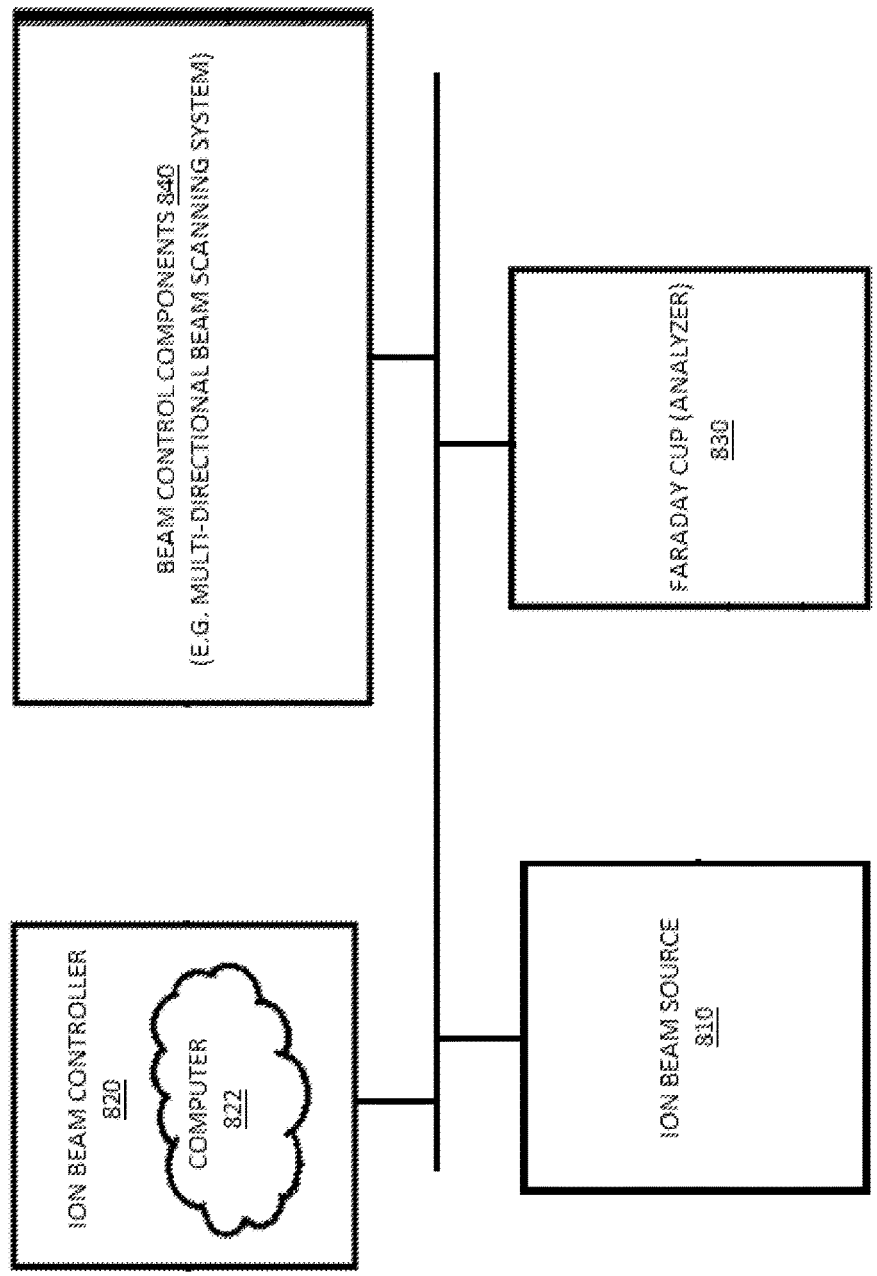
FIG. 8 illustrates an ion beam controller system.

As shown in FIG. 8, a simplified schematic block diagram of the system for controlling a high-power ion beam may comprise an ion beam source 810 that generates an ion beam, an ion beam controller 820, which may have a computer 822 configured to analyze measurement signals from a faraday cup 830, and to send control signals to beam control components 840, such as the multi-directional beam scanning system described above. Note that the beam source 810, controller 820, computer 822 and/or beam control components 840 may be co-located in any combination, or may be individual (separate) devices interconnected by communication links (e.g., a communication bus/network as shown).

Figure 9:
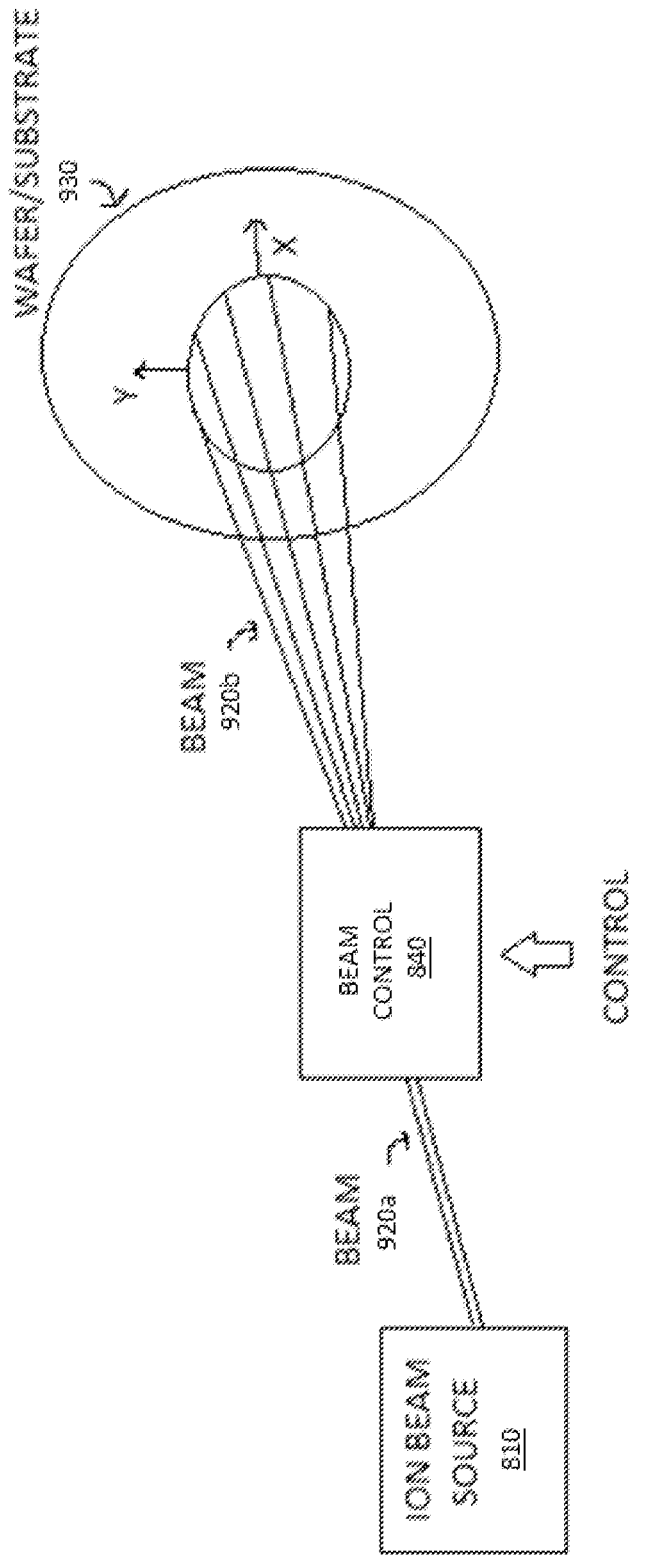
FIG. 9 illustrates an example ion beam striking a target wafer/substrate.

With reference to FIG. 9, a simplified schematic diagram of the ion beam system and target wafer/substrate is shown for illustration. For instance, an ion beam source (generator) 810 is configured to generate an ion beam 920a toward a target substrate 930. By passing through beam control components 840 (or "scanner"), the ion beam 420b is controlled to strike the target substrate 930 across a particular X-Y range. Note that the scanner 840 may be spaced at a drift length (distance) away from the target substrate 930 to account for a desired size (X-Y coverage) of the beam at the target substrate, for example, for singular wafers or small batches of wafers (closer for less coverage), or for larger production tool batches (further away for more coverage).

Figure 10:
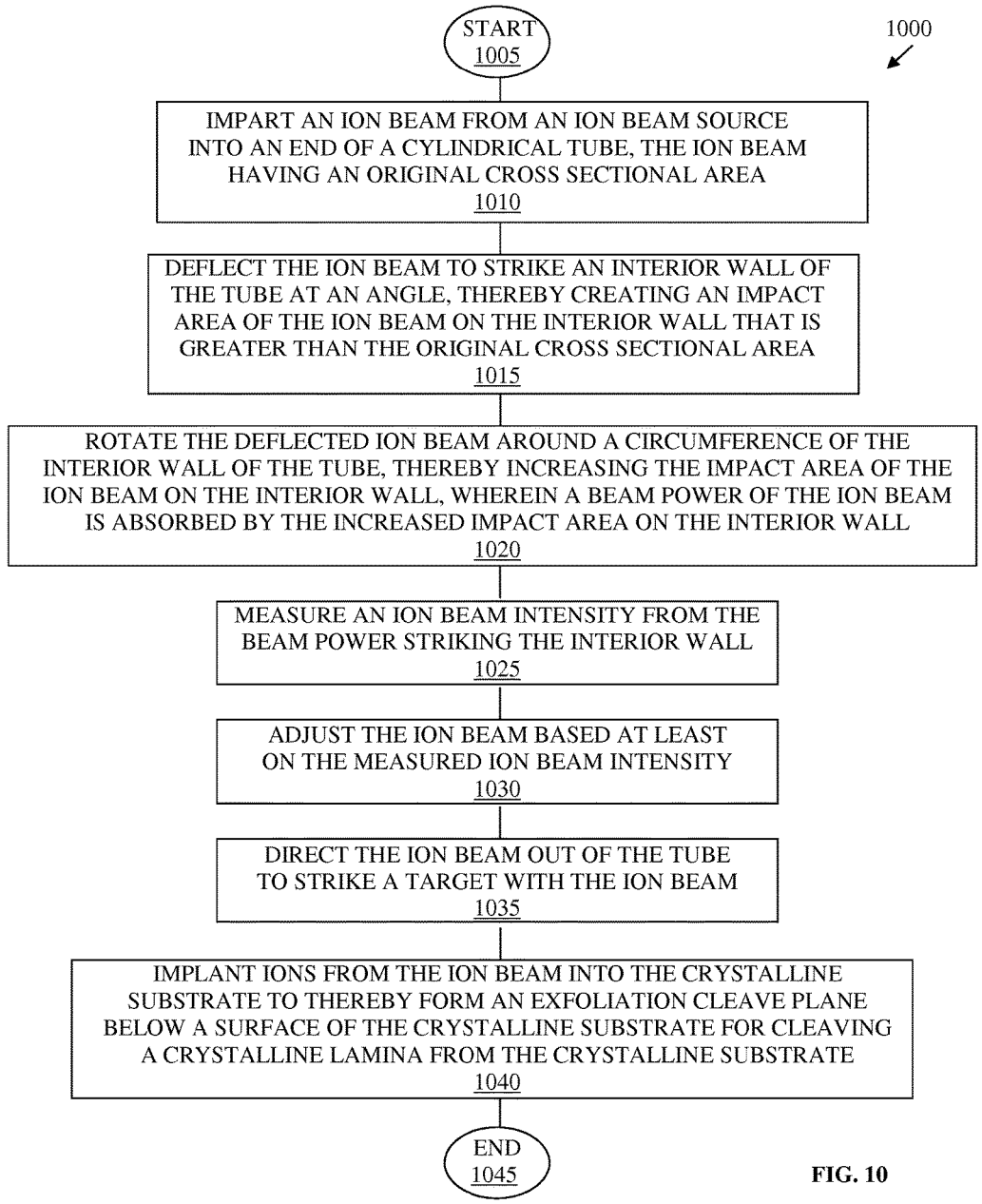
FIG. 10 illustrates an example simplified procedure for controlling a high-power ion beam, particularly for dissipating the power of the ion beam, among other features.

FIG. 10 illustrates an example simplified procedure 1000 for controlling a high-power ion beam in accordance with one or more embodiments described herein, particularly for dissipating the power of the ion beam, among other features. The procedure 1000 may start at step 1005, and continues to step 1010, where, as described in greater detail above, an ion beam (having an original cross sectional area) is imparted from an ion beam source into an end of a cylindrical tube. In step 1015, the ion beam may then be deflected (e.g., in 'dump' mode) to strike an interior wall of the tube at an angle, thereby creating an impact area of the ion beam on the interior wall that is greater than the original cross sectional area. Note that as mentioned above, the tube may have other cross-sectional shapes, and, further, the angle may be determined based on an interior size of the tube and a desired impact area of the ion beam on the interior wall. In step 1020, the deflected ion beam may then be rotated around a circumference of the interior wall of the tube, thereby increasing the impact area of the ion beam on the interior wall, such that a beam power of the ion beam is absorbed by the increased impact area on the interior wall.

Note that where the tube is a faraday cup, in step 1025 an ion beam intensity from the beam power striking the interior wall may be measured as described above. For instance, when the interior wall is segmented into a plurality of sections, independent measurements may be made for ion beam intensities of the beam power striking a respective section of the plurality of sections (e.g., and particularly when scanning the deflected ion beam across the plurality of sections). By using a faraday cup, information regarding one or more of an intensity, size, shape, and direction of the ion beam may be determined, as described above. (In particular, in one specific embodiment, mass spectrometry may even be performed based on the independently measured ion beam intensities.) Also, in step 1030, the ion beam may be adjusted based at least on the measured ion beam intensity (e.g., and size, shape, etc.).

In one embodiment, in step 1035, the ion beam may also be directed out of the tube (e.g., in "pass through" mode) to strike a target with the ion beam, such as to implant ions from the ion beam into a crystalline substrate in step 1040 to thereby form an exfoliation cleave plane below a surface of the crystalline substrate for cleaving a crystalline lamina from the crystalline substrate (as described below).

The procedure 1000 illustratively ends in step 1045, though notably with the option to go back and forth between dump/measure mode and pass-through/implant mode, and to adjust the ion beam according to measurements, accordingly.

Figure 11:
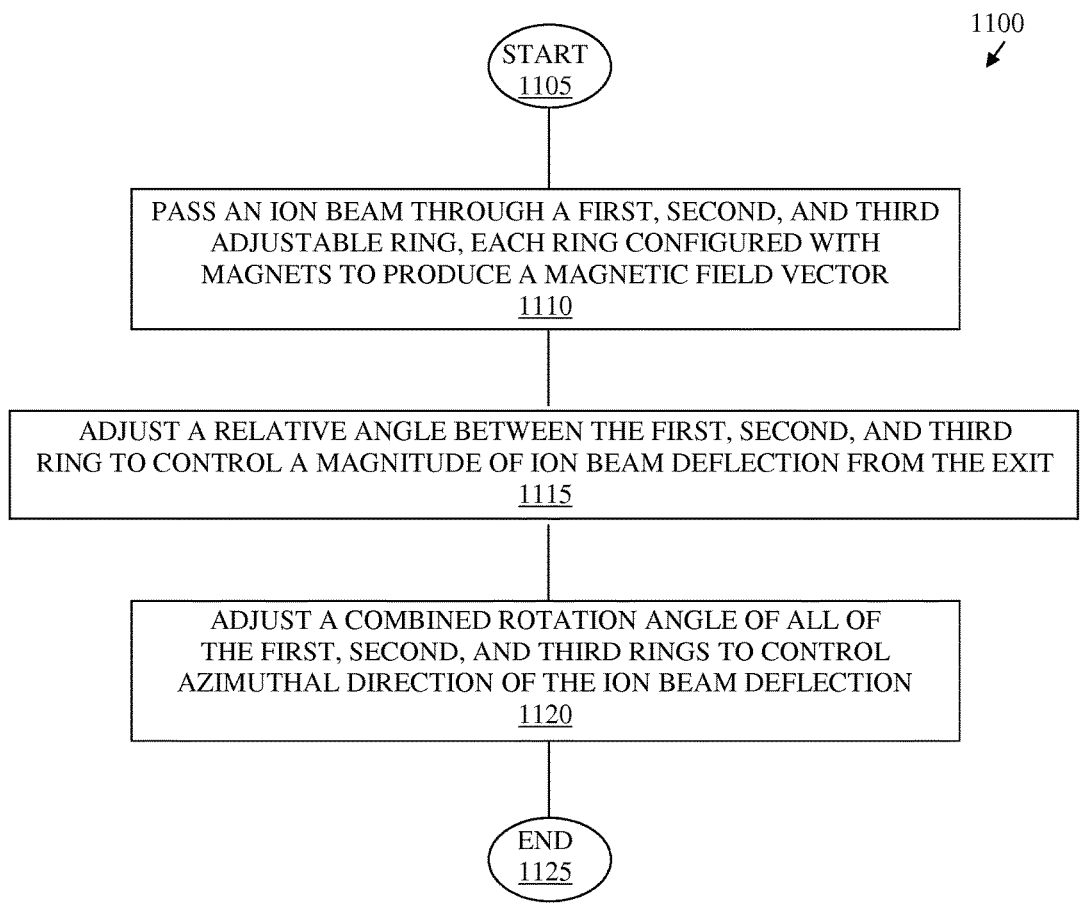
FIG. 11 illustrates an example simplified procedure for controlling an ion beam, particularly for controlling the beam with a multi-directional beam scanning system.

In addition, FIG. 11 illustrates an example simplified procedure 1100 for controlling an ion beam in accordance with one or more embodiments described herein, particularly for controlling the beam with a multi-directional beam scanning system as described above. The procedure 1100 may start at step 1105, and continues to step 1110, where, as described in greater detail above, an ion beam may be passed through a first, second, and third adjustable ring, each ring configured with magnets to produce a magnetic field vector. Then in step 1115, a relative angle between the first, second, and third ring may be adjusted to control a magnitude of ion beam deflection from the exit. For example, as described above, this may deflect the ion beam to strike an interior wall of a tube at an angle, thereby creating an impact area of the ion beam on the interior wall that is greater than an original cross sectional area of the ion beam. In step 1120, a combined rotation angle of all of the first, second, and third rings may also be adjusted to control azimuthal direction of the ion beam deflection (e.g., spinning/rotating the entire magnetic assembly). In this manner, as described above, the deflected ion beam may be rotated around a circumference of the interior wall of the tube, thereby increasing the impact area of the ion beam on the interior wall, such that a beam power of the ion beam is absorbed by the increased impact area on the interior wall. The simplified procedure 1100 ends in step 1125, though notably with the option to control the magnitude and azimuthal direction of the beam deflection.

It should be noted that while certain steps within procedures 1000-1100 may be optional as described above, the steps shown in FIGS. 10-11 are merely examples for illustration, and certain other steps may be included or excluded as desired. Further, while a particular order of the steps is shown, this ordering is merely illustrative, and any suitable arrangement of the steps may be utilized without departing from the scope of the embodiments herein. Moreover, while procedures 1000-1100 are described separately, certain steps from each procedure may be incorporated into each other procedure, and the procedures are not meant to be mutually exclusive.

Note that the techniques herein may be used with any ion beam system, particularly those with high-power beams. For instance, in one embodiment a proton ion beam emerging from the tube can be directed at a lithium target in order to provide a source of neutrons resulting from the Li(p,n) nuclear reaction. This reaction is widely considered to be the primary neutron producing reaction for use in accelerator-based Boron Neutron Capture Therapy (BNCT). It requires high power proton accelerator technology that is capable of reliably producing and controlling 20-30 mA proton beams with energies up to 2.5 MeV.

In another example embodiment as mentioned above, ion implantation may occur during a layer exfoliation process to exfoliate a layer of a target substrate. That is, the tube as described above may have an egress that allows directing the ion beam out of the tube to strike a crystalline substrate target to implant ions from the ion beam into the crystalline substrate, thereby forming an exfoliation cleave plane below a surface of the crystalline substrate for cleaving a crystalline lamina from the crystalline substrate.

For instance, an illustrative layer exfoliation process may comprise providing a donor body of the target substrate and implanting through a top surface of the donor body with an ion dosage. Using this implantation method, a cleave plane is formed beneath the top surface of the donor body, and a thin layer can then be exfoliated from the donor body along this cleave plane. The ion dosage can comprise, for example, hydrogen, helium, or a combination thereof. Implantation conditions can be varied as needed to produce a particular lamina (e.g., sapphire lamina) having targeted properties, such as thickness and strength. For example, the ion dosage may be any dosage between about $1.0 \times 10^{14}$ and $1.0 \times 10^{18}$ $H/cm^2$, such as $0.5-3.0 \times 10^{17}$ $H/cm^2$. The dosage energy can also be varied, such as between about 500 keV to about 3 MeV. In some embodiments, the ion implantation temperature may be maintained between about 200 and 950° C., such as between 300 and 800° C. or between 550 and 750° C. In some embodiments, the implant temperature may be adjusted depending upon the specific type of material and the orientation of the donor body. Other implantation conditions that may be adjusted may include initial process parameters such as implant dose and the ratio of implanted ions (such as H/He ion ratio). In other embodiments, implant conditions may be optimized in combination with exfoliation conditions such as exfoliation temperature, exfoliation susceptor vacuum level, heating rate and/or exfoliation pressure. For example, exfoliation temperature may vary between about 400° C. to about 1200° C. By adjusting implantation and exfoliation conditions, the area of the resulting lamina that is substantially free of physical defects can be maximized. The resulting exfoliated layer may be further processed if needed, such as to produce smooth final surfaces.

In one specific embodiment, the system described herein may use a much higher voltage than conventional techniques to accelerate the ions (e.g., hydrogen) to high enough velocity so that they penetrate to the required depth below the surface of the substrate (e.g., sapphire). For instance, it is capable of producing hydrogen ion beams at energies up to 2 MeV, and with a high intensity (e.g., currents up to 50 mA). These high currents are required to meet the productivity and cost objectives of large scale manufacturing of sapphire lamina. In addition to the vacuum environment within the tube, the entire system may be packaged in a high-pressure tank, using pressurized gas, such as $SF_6$, that has very good electrical insulation properties, enabling operation at these high voltages. Also, in one specific embodiment, after emerging from an accelerator (beam generator), the beam may be focused and deflected through 45 degrees by an analyzing magnet which filters out all unwanted ions. In so doing, the beam transported to the process chamber is greater than 99.9% pure.

Note that the present invention may be used to prepare a cover plate of an electronic device. In a specific embodiment, the method comprises the steps of providing a donor body, such as sapphire, implanting through the top surface of the donor body with an ion dosage to form a cleave plane beneath the top surface, exfoliating the layer from the donor body along the cleave plane, and forming the cover plate comprising this layer, which has a thickness of less than 50 microns. Preferably, the ion dosage comprises hydrogen or helium ions.

For example, there are many types of mobile electronic devices currently available which include a display window assembly that is at least partially transparent. These include, for example, handheld electronic devices such media players, mobile telephones (cell phones), personal data assistants (PDAs), pagers, and laptop computers and notebooks. The display screen assembly may include multiple component layers, such as, for example, a visual display layer such as a liquid crystal display (LCD), a touch sensitive layer for user input, and at least one outer cover layer used to protect the visual display. Each of these layers are typically laminated or bonded together.

Many of the mobile electronic devices used today are subjected to excessive mechanical and/or chemical damage, particularly from careless handling and/or dropping, from contact of the screen with items such as keys in a user's pocket or purse, or from frequent touch screen usage. For example, the touch screen surface and interfaces of smartphones and PDAs can become damaged by abrasions that scratch and pit the physical user interface, and these imperfections can act as stress concentration sites making the screen and/or underlying components more susceptible to fracture in the event of mechanical or other shock. Additionally, oil from the use's skin or other debris can coat the surface and may further facilitate the degradation of the device. Such abrasion and chemical action can cause a reduction in the visual clarity of the underlying electronic display components, thus potentially impeding the use and enjoyment of the device and limiting its lifetime.

Various methods and materials have been used in order to increase the durability of the display windows of mobile electronic devices. For example, polymeric coatings or layers can be applied to the touch screen surface in order to provide a barrier against degradation. However, such layers can interfere with the visual clarity of the underlying electronic display as well as interfere with the touch screen sensitivity. Furthermore, as the coating materials are often also soft, they can themselves become easily damaged, requiring periodic replacement or limiting the lifetime of the device.

Another common approach is to use more highly chemically and scratch resistant materials as the outer surface of the display window. For example, touch sensitive screens of some mobile devices may include a layer of chemically-strengthened alkali aluminosilicate glass, with potassium ions replacing sodium ions for enhanced hardness, such as the material referred to as "gorilla glass" available from Corning. However, even this type of glass can be scratched by many harder materials, and, further, as a glass, is prone to brittle failure or shattering. Sapphire has also been suggested and used as a material for either the outer layer of the display assembly or as a separate protective sheet to be applied over the display window. However, sapphire is relatively expensive, particularly at the currently available thicknesses, and is not readily available as an ultrathin layer.

Accordingly, use of the compact magnetic scanner system herein may provide the ion implantation that can be used for the exfoliation of one or more sapphire layers having a thickness of less than 50 microns, such as less than 30 microns, less than 25 microns, and less than 15 microns.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. For example, while a cylindrical tube is shown and described, it is expressly contemplated that a variety of cross-sections are possible, such as square, rectangular, oval, triangular, etc., and that the dimensions of the tube need not be uniform along the length of the tube (e.g., wider or narrower in parts, rounded or square in parts, etc.). Notably, different shapes (e.g., with a flat interior wall surface) may provide greater accuracy when performing faraday cup measurement and analysis. Also, while the preferred embodiment is for a beam-surrounding tube, an absorption plate that is generally parallel to the beam in "pass-through" mode be used, where the beam is deflected to strike the plate in a similar manner as the interior wall of a tube as described above. It is thus intended that the scope of the invention be defined by the claims appended hereto, and their equivalents.

What is claimed is:

1. A method for controlling an ion beam, the method comprising:
    imparting an ion beam from an ion beam source into an end of a cylindrical tube, the ion beam having an original cross sectional area;
    deflecting the ion beam to strike an interior wall of the tube at an angle, thereby creating an impact area of the ion beam on the interior wall that is greater than the original cross sectional area; and
    rotating the deflected ion beam around a circumference of the interior wall of the tube, thereby increasing the impact area of the ion beam on the interior wall;
    wherein a beam power of the ion beam is absorbed by the increased impact area on the interior wall.

2. The method as in claim 1, wherein the tube is a faraday cup, the method further comprising:
    measuring an ion beam intensity from the beam power striking the interior wall.

3. The method as in claim 2, wherein the interior wall is segmented into a plurality of sections, the method further comprising:
    independently measuring ion beam intensities of the beam power striking a respective section of the plurality of sections.

4. The method as in claim 3, further comprising:
    determining information regarding one or more of a size, shape, and direction of the ion beam based on the independently measured ion beam intensities.

5. The method as in claim 3, further comprising:
    scanning the deflected ion beam across the plurality of sections; and
    measuring ion beam information based on the deflected ion beam being scanned over at least a particular one of the plurality of sections over time.

6. The method as in claim 2, further comprising:
    adjusting the ion beam based at least on the measured ion beam intensity.

7. The method as in claim 1, wherein the tube has an egress at an end opposite the ion beam source, the method further comprising:
    directing the ion beam out of the tube to strike a target with the ion beam.

8. The method as in claim 1, wherein deflecting the ion beam and rotating the deflected ion beam are performed using a multi-directional beam scanning system comprising:
    using a first, second, and third adjustable ring defining an aperture configured to allow passage of the ion beam, each ring configured with magnets to produce a magnetic field vector, the first ring nearest an entrance of the ion beam passage, the third ring nearest an exit of the ion beam passage, and the second ring between the first and third rings;
    adjusting a relative angle between the first, second, and third ring to control a magnitude of ion beam deflection from the exit; and
    adjusting a combined rotation angle of all of the first, second, and third rings to control azimuthal direction of the ion beam deflection.

9. The method as in claim 1, wherein deflecting the ion beam and rotating the deflected ion beam are performed using a multi-directional beam scanning system located outside of an evacuated beam chamber through which the ion beam travels.

10. The method as in claim 1, wherein deflecting the ion beam is performed using an electromagnet system.

11. The method as in claim 1, wherein rotating the deflected ion beam is performed using a stationary electromagnet system.

12. A system for controlling an ion beam, the system comprising:
    a cylindrical tube;
    an ion beam source configured to impart an ion beam into an end of the cylindrical tube, the ion beam having an original cross sectional area; and
    an ion beam controller configured to:
    deflect the ion beam to strike an interior wall of the tube at an angle, thereby creating an impact area of the ion beam on the interior wall that is greater than the original cross sectional area; and
    rotate the deflected ion beam around a circumference of the interior wall of the tube, thereby increasing the impact area of the ion beam on the interior wall, wherein a beam power of the ion beam is absorbed by the increased impact area on the interior wall.

13. The system as in claim 12, wherein the tube is a faraday cup, the system further comprising:
    a faraday cup analyzer configured to measure an ion beam intensity from the beam power striking the interior wall.

14. The system as in claim 13, wherein the interior wall is segmented into a plurality of sections, the faraday cup analyzer further configured to independently measure ion beam intensities of the beam power striking a respective section of the plurality of sections.

15. The system as in claim 14, wherein the faraday cup analyzer is further configured to determine information regarding one or more of a size, shape, and direction of the ion beam based on the independently measured ion beam intensities.

16. The system as in claim 13, wherein the ion beam controller is further configured to scan the deflected ion beam across the plurality of sections, and wherein the faraday cup analyzer is further configured to measure ion beam information based on the deflected ion beam being scanned over at least a particular one of the plurality of sections over time.

17. The system as in claim 12, wherein the tube has an egress at an end opposite the ion beam source, the ion beam controller further configured to direct the ion beam out of the tube to strike a target with the original cross section of the ion beam.

18. The system as in claim 12, wherein the ion beam controller comprises a multi-directional beam scanning system.

19. The system as in claim 18, wherein the multi-directional beam scanning system comprises:
    a first, second, and third adjustable ring defining an aperture configured to allow passage of the ion beam, each ring configured with magnets to produce a magnetic field vector, the first ring nearest an entrance of the ion beam passage, the third ring nearest an exit of the ion beam passage, and the second ring between the first and third rings;

wherein adjusting a relative angle between the first, second, and third ring controls a magnitude of ion beam deflection from the exit; and wherein adjusting a combined rotation angle of all of the first, second, and third rings controls azimuthal direction of the ion beam deflection.

20. The system as in claim 18, wherein the multi-directional beam scanning system is located outside of an evacuated beam chamber through which the ion beam travels.

21. The system as in claim 12, wherein the ion beam controller comprises an electromagnet system.

22. The system as in claim 21, wherein the electromagnet system comprises a stationary electromagnet system configured to rotate the deflected ion beam.

\* \* \* \* \*